(12) United States Patent
Priewasser

(10) Patent No.: US 9,704,749 B2
(45) Date of Patent: Jul. 11, 2017

(54) METHOD OF DIVIDING WAFER INTO DIES

(71) Applicant: DISCO Corporation, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/970,756

(22) Filed: Dec. 16, 2015

(65) Prior Publication Data
US 2016/0190010 A1  Jun. 30, 2016

(30) Foreign Application Priority Data
Dec. 29, 2014 (DE) .................. 10 2014 227 005

(51) Int. Cl.
*H01L 21/00* (2006.01)
*H01L 21/78* (2006.01)
(Continued)

(52) U.S. Cl.
CPC ........ *H01L 21/78* (2013.01); *H01L 21/02013* (2013.01); *H01L 21/6835* (2013.01);
(Continued)

(58) Field of Classification Search
CPC ....... H01L 2924/00; H01L 2924/12042; H01L 2924/0665; H01L 2224/32225; H01L 21/304; H01L 21/6836
See application file for complete search history.

(56) References Cited

U.S. PATENT DOCUMENTS 6,184,109 B1 * 2/2001 Sasaki ................. H01L 21/3043
                                                              257/E21.238
6,294,439 B1 * 9/2001 Sasaki ................. H01L 21/3043
                                                              257/E21.238
(Continued)

FOREIGN PATENT DOCUMENTS

JP  2003-234455 A   8/2003
JP  2004-014956 A   1/2004
(Continued)

OTHER PUBLICATIONS

Korean Notice of Allowance issued in counterpart Korean Patent App. No. 10-2015-0184831, dated Apr. 27, 2017 (with partial translation).

*Primary Examiner* — Zandra Smith
*Assistant Examiner* — John M Parker
(74) *Attorney, Agent, or Firm* — Greer Burns & Crain Ltd.

(57) ABSTRACT

A method of dividing a wafer, having on one side a device area with a plurality of devices partitioned by a plurality of division lines and a peripheral marginal area with no devices formed around the device area, into dies is provided. The method comprises: attaching an adhesive tape for protecting devices on the wafer to the one side of the wafer, the adhesive tape adhering to at least some, optionally all, of the devices; connecting a carrier for supporting the adhesive tape to the side of the adhesive tape being opposite to the side in contact with the devices by connecting means; grinding that side of the wafer being opposite the one side for adjusting the wafer height; and cutting the wafer along the division lines. The method is characterized by locating the connecting means completely outward of the device area of the wafer in a top view thereon.

12 Claims, 3 Drawing Sheets

(51) Int. Cl.
*H01L 21/683* (2006.01)
*H01L 21/02* (2006.01)

(52) U.S. Cl.
CPC .. *H01L 21/6836* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)

(56) References Cited

U.S. PATENT DOCUMENTS

| | | | |
|---|---|---|---|
| 6,337,258 B1* | 1/2002 | Nakayoshi | H01L 21/3043 257/E21.238 |
| 8,426,293 B2* | 4/2013 | Tsurume | B32B 37/226 257/618 |
| 2003/0129809 A1 | 7/2003 | Takyu et al. | |
| 2004/0048419 A1 | 3/2004 | Kitamura et al. | |
| 2006/0276010 A1 | 12/2006 | Bradl et al. | |
| 2009/0294913 A1 | 12/2009 | Kawashima | |
| 2010/0081235 A1* | 4/2010 | Furumura | G06K 19/07749 438/113 |
| 2012/0018854 A1* | 1/2012 | Kato | H01L 21/67092 257/622 |
| 2012/0286429 A1* | 11/2012 | Han | H01L 21/78 257/774 |
| 2014/0318697 A1 | 10/2014 | Tan et al. | |

FOREIGN PATENT DOCUMENTS

| | | |
|---|---|---|
| JP | 2005-123568 A | 5/2005 |
| JP | 2008-258282 A | 10/2008 |
| JP | 2010-056562 A | 3/2010 |
| JP | 2011-023659 A | 2/2011 |
| JP | 2011-159679 A | 8/2011 |
| JP | 2013-135038 A | 7/2013 |
| JP | 2014-135348 A | 7/2014 |
| JP | 2014-165246 A | 9/2014 |
| JP | 2014-165388 A | 9/2014 |
| WO | WO 2009/081880 A1 | 7/2009 |

* cited by examiner

METHOD OF DIVIDING WAFER INTO DIES

TECHNICAL FIELD

The present invention relates to a method of dividing a wafer, having on one side a device area with a plurality of devices partitioned by a plurality of division lines and a peripheral marginal area with no devices formed around the device area, into dies according to the preamble of claim 1.

PRIOR ART

In a semiconductor device fabrication process, a wafer having a device area with a plurality of devices partitioned by a plurality of division lines is divided into individual dies. This fabrication process generally comprises a grinding step of adjusting the wafer height and a cutting step of cutting the wafer along the division lines for obtaining the dies. To protect the devices formed on the wafer during this fabrication process and for positioning the individual dies, an adhesive tape can be attached to the wafer side having the devices formed thereon. However, this adhesive tape is easily deformable due to the drawback that, during the fabrication process, the individual dies, which are attached to the adhesive tape, might be shifted in position. Such a die shift complicates the die pick up, requiring complex and expensive fabrication machines.

The Applicant knows of a method for dividing a wafer into dies in which a carrier for supporting the adhesive tape is attached thereto. The carrier is made of a rigid, hard material that is glued to the whole surface of the adhesive tape, thus eliminating or at least substantially reducing a die shift. As a result, less complex and therefore cheaper fabrication machines can be provided. However, the known device fabrication process using the carrier has the drawback that unit costs are increased.

SUMMARY OF THE INVENTION

Accordingly, it is an object of the present invention to provide a method for dividing a wafer into dies that allows for an elimination of a die shift with low unit costs.

The present invention is based on the thought that the relatively high unit costs of the methods in the state of the art are primarily caused by the following factors. In the process of peeling off a wafer from a carrier, the wafer is subjected to large bending stresses, which may result in breakage of the wafer and/or damage to the devices formed on the wafer. Due to the bending of the wafer in the detachment process of the carrier, partially separated dies may touch each other and thus be damaged. Further, large bending stresses also act on the carrier upon detachment thereof. The carrier may thus be compromised or even broken in the removal process, rendering its reuse unfeasible. For the reasons given above, the wafer has to be detached from the carrier very slowly and carefully, leading to a reduction in productivity, i.e., a reduced throughput of processed units per hour, and therefore increased processing costs.

The inventor has found that the drawbacks identified above are attributable to the fact that the carrier is glued to the adhesive tape over its whole surface area. Accordingly, due to the large glued area, the detachment of the carrier from the wafer generates large bending stresses which are likely to cause damage to the wafer and/or the carrier. Further, a treatment of the glued area for allowing a carrier detachment is likely to damage devices since the devices and the glued area are positioned above one another. The result is a relatively high rejection rate, leading to high unit costs.

Therefore, the present inventive method of dividing a wafer, having on one side a device area with a plurality of devices partitioned by a plurality of division lines and a peripheral marginal area with no devices formed around the device area, into dies comprises the steps of attaching an adhesive tape for protecting devices on the wafer to the one side of the wafer, the adhesive tape adhering to at least some, optionally all, of the devices; connecting a carrier, being made of a material harder and more rigid than that of the adhesive tape, for supporting the adhesive tape to the side of the adhesive tape being opposite to the side in contact with the devices, by connecting means; grinding the side of the wafer being opposite to the one side for adjusting the wafer height; and cutting the wafer along the division lines, characterized by locating the connecting means completely outward of the device area of the wafer in a top view thereon. The carrier is a hard and/or rigid carrier.

Accordingly, the inventive method significantly reduces the area in which carrier and adhesive tape are connected. Thus, it is less likely that the carrier is damaged upon detachment. Further, upon treatment of the connecting means for allowing a carrier detachment, the devices are not easily damaged since they are located apart from the area where the connecting means is present. As a consequence, a method of dividing a wafer into dies is provided that mitigates the problem of die shifting and allows for low unit costs since the rejection rate is reduced.

The above method may be performed in the listed order such that the grinding is performed before the cutting. This allows for a cutting of the wafer from the backside, namely that side where the devices are not present. Accordingly, the risk of damaging the devices is reduced, further minimizing the rejection rate and decreasing the unit costs.

The connecting means may exhibit adhesive characteristics that are removable by an external stimulus, such as an energy input, the connecting means preferably including UV-curable glue, thermal-curable glue, or a combination thereof. Accordingly, an easy and contactless detachment of the carrier is possible, minimizing the risk of carrier damage and allowing for low unit costs. Alternatively, the connecting means may include water-soluble glue.

The method may comprise the step of inputting energy into the connecting means for releasing the connection between carrier and adhesive tape and removing the carrier from the adhesive tape.

The connecting means may exhibit an annular shape. This leads to the advantage that a good compromise is achieved between a large enough connection area for fixing the adhesive tape in place and a small enough connection area for allowing a detachment of carrier with low risk of damage. Further, the annular form allows for a cheap and less complex processing of the connecting means. In addition, the annular shape provides a good fixation of the adhesive tape on the carrier such that a die shift can be prevented to a good extent.

The method may comprise the forming of a recess, preferably an annular recess, in the carrier for insertion of the connecting means. This allows for an integration of the connecting means into the carrier. Thus, a set of wafer and carrier is provided that is easily handleable. Further, due to the fact that the carrier is made of a relatively hard and rigid material, the recess can be formed easily with high precision therein. Therefore, the method allows for a good processing quality. Alternatively, the recess could also be formed in the adhesive tape or in the adhesive tape and the carrier in combination.

The one side of the wafer, in other words the side of the wafer where the devices are formed, may be fully or partially cut, e.g., half cut or grooved, by a laser, wherein a further area of the wafer is preferably cut mechanically. The further area of the wafer may be cut mechanically from the one side of the wafer or from the side of the wafer being opposite to the one side. Due to the fact that the side of the wafer having the devices formed thereon often exhibits a brittle low-k layer, the cutting thereof with a laser ensures a good processing quality. The mechanical cutting of a further, preferably the remaining, wafer area allows for a precise adjustment of the cutting depth.

The side of the wafer being opposite to the one side may be mechanically partially cut and a further area of the wafer may be cut by laser from the side of the wafer being opposite to the one side. Preferably, the remaining area of the wafer, i.e., the remainder of the wafer in the height or thickness direction thereof in the region or regions where the partial cut or cuts had been formed, is cut by laser from the side of the wafer being opposite to the one side.

The cutting of the wafer may be performed before grinding of the wafer. This allows for a cutting at a time when the wafer still exhibits a significant thickness. Accordingly, a warping of the wafer and/or a breaking out of the cut can be prevented, resulting in an increased processing quality.

The method may include a step of parallelizing the surface of the adhesive tape opposite the surface contacting the devices with the surface of the wafer opposite the one side where the devices are formed. This provides a higher processing precision, also leading to an increased processing quality.

The method may further comprise the attaching of an adhesive pick up tape to the ground surface of the wafer. This step allows for an easy detachment of the carrier from the adhesive tape and the adhesive tape from the one side of the wafer since the dies are held by the adhesive pick up tape. The adhesive pick up tape may further be configured to be radially stretchable. The method may then comprise a step of stretching the adhesive pick up tape to increase the distances between dies and allowing an easier die pick up.

The carrier may be made of glass and/or silicon. If the carrier is made of glass, energy input into the connecting means is possible with radiation that is transmittable through glass, for instance UV radiation. If the carrier is made of silicon, a cheap carrier is provided. Also a combination of the two materials is possible.

DETAILED DESCRIPTION OF A PREFERRED EMBODIMENT

A preferred embodiment of the present invention will now be described with reference to the accompanying drawings.

The following preferred embodiment relates to a method for dividing a wafer W into dies. The wafer W can be a MEMS wafer having MEMS devices formed on a side surface thereof, which is called a pattern side 1 in the following description. However, the wafer W is not limited to a MEMS wafer, but may also be a CMOS wafer having CMOS devices, preferably as solid-state imaging devices, formed on the pattern side 1 thereof. The wafer W can be made of silicon. Such a silicon wafer W can include devices as ICs (integrated circuits) and LSIs (large scale integrations) on a silicon substrate or may be an optical device wafer configured by forming optical devices such as LEDs (light emitting diodes) on an inorganic material substrate of ceramic, glass or sapphire. The wafer W is not limited to this and can be formed in any other way. Furthermore, also a combination of the above described exemplary wafer designs is possible. The wafer can have a thickness before grinding in the μm range, preferably in the range of 625 to 925 μm.

The wafer W preferably exhibits a circular shape with a plurality of crossing division lines, called streets, formed on the pattern side 1 thereof, thereby partitioning the wafer W into a plurality of rectangular regions where devices, such as those described previously, are respectively formed. These devices are preferably formed in a central area of the wafer W called a device area 2, as for instance illustrated in FIG. 4. In the case of a circular wafer W, this device area 2 is preferably circular and arranged concentrically with the outer circumference of the wafer W. The device area 2 is surrounded by an annular peripheral marginal area 3 surrounding the device area 2, as for instance illustrated in FIG. 4. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and is preferably between 1-3 mm.

In the following, a method for dividing a wafer W according to the preferred embodiment of the present invention is described with reference to FIGS. 1 to 10.

Figure 1:
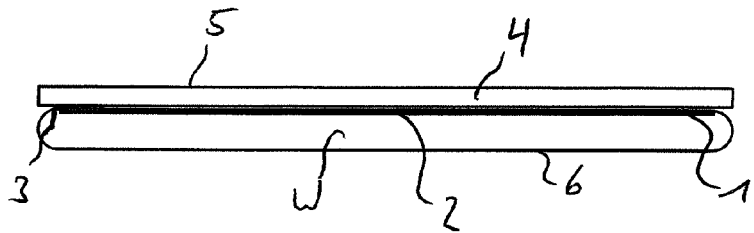
FIG. 1 is a cross-sectional view illustrating a first step of a method for dividing a wafer according to a preferred embodiment of the present invention.

FIG. 1 depicts the outcome of a first step of the method for dividing a wafer according to the preferred embodiment of the present invention. In the first step, an adhesive tape 4 is attached to the pattern side 1 of a wafer W. In other words, the pattern side 1 is laminated with an adhesive tape 4. The adhesive tape 4 preferably has the identical shape as the wafer W and is attached thereto concentrically. When attached to the wafer W, the adhesive tape 4 adheres to the devices formed in the device area 2 of the pattern side 1. The adhesive tape 4 allows for a protection of the devices formed in the device area 2 of wafer W.

Figure 2:
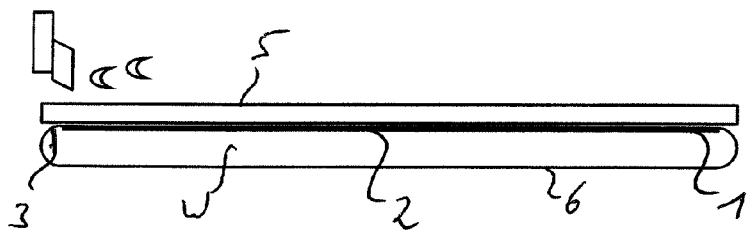
FIG. 2 is a cross-sectional view illustrating a second step of the method for dividing a wafer according to the preferred embodiment of the present invention.

FIG. 2 illustrates a second step of the method for dividing a wafer according to the preferred embodiment of the present invention. It is to be noted that this second step is optional for the method according to this preferred embodiment. In this second step, the surface of the adhesive tape 4, which is oriented away from the wafer W, is parallelized to the surface of the wafer W, which is oriented away from the adhesive tape 4. Due to the fact that the devices are formed on the pattern side 1 of wafer W, the top surface 5 of the adhesive tape 4 might exhibit an uneven surface profile due to the devices formed below it. The distance between the lowest point of this top surface 5, which is that point of the surface that is the closest to the wafer W, and the highest point of this top surface 5, which is that point that is the most far away from the wafer W, can be around 70 µm. Through the parallelization in this second step, this distance can be, for example, reduced to around 2 µm. The parallelization can be preferably achieved by chucking the wafer W on a chuck table and moving, for example, a milling device along the top surface 5 such that the machining plane of the milling device is oriented in parallel to the back surface 6 of wafer W. The total thickness value of wafer W with laminated adhesive tape 4 can be improved by this second step.

Figure 3:
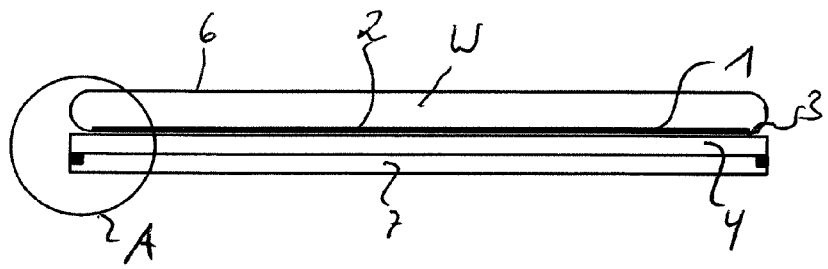
FIG. 3 is a cross-sectional view illustrating third, fourth and fifth steps of the method for dividing a wafer according to the preferred embodiment of the present invention.
Figure 4:
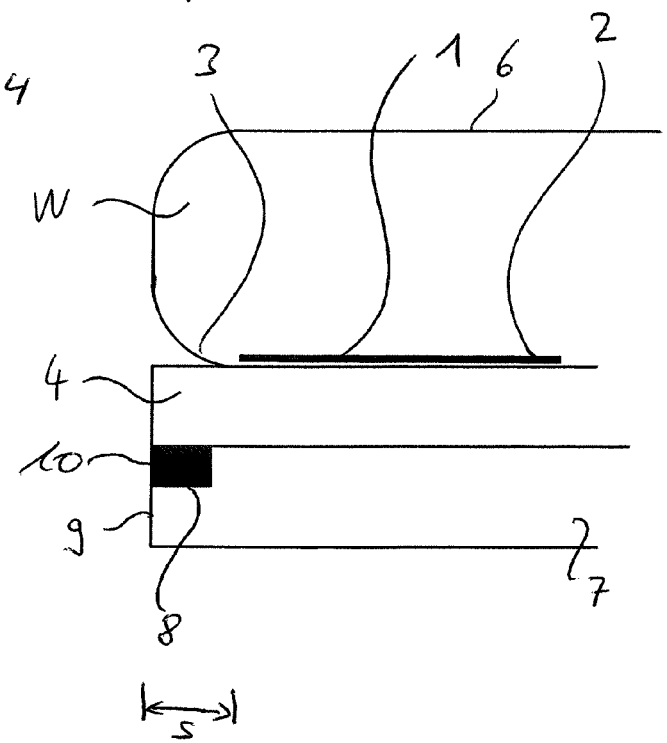
FIG. 4 is an enlarged view of the region A in FIG. 3.

FIGS. 3 and 4 exhibit the outcome of a third, fourth and fifth step of the method for dividing a wafer according to this preferred embodiment. In the third step of this preferred embodiment, a hard carrier 7 is provided. The hard carrier 7 is preferably made of a material that is significantly harder and more rigid than the material of the adhesive tape 4. The hard carrier 7 is for instance made of silicon, glass or a combination thereof. Preferably, the hard carrier 7 is formed congruently with and is arranged concentrically to the adhesive tape 4, as illustrated in FIG. 3. The hard carrier 7 may for example exhibit a height of 500-1000 µm.

In a fourth step of this preferred embodiment, which is optionally for this embodiment, an annular recess 8, for instance a notch, is formed concentrically in the hard carrier 7, as illustrated in FIG. 4. Preferably, the annular recess 8 has a rectangular profile in cross section and/or extends from the outer peripheral surface 9 of the hard carrier 7 radially inward. In the height direction of the hard carrier 7, the recess 8 can extend along approximately half of the carrier height. The hard carrier 7 exhibits an outer annular portion s, which preferably extends from the outer circumference 9 of the wafer W radially inward. The annular portion s preferably corresponds to the peripheral marginal area 3 of the wafer W, when the hard carrier 7 is attached concentrically to the adhesive tape 4. The extension and arrangement of the recess 8 is defined as being within the outer annular portion s. Accordingly, when the hard carrier 7 is attached concentrically to the adhesive tape 4, the recess 8 does not extend in the device area 2 of the wafer W in a top view thereon, as illustrated in FIG. 4. It is to be noted that the recess 8 can also start from a radial position that is shifted radially inward from the outer circumference 9 of the hard carrier 7. Further, profiles different from a rectangular profile are possible, for instance a triangular profile or a semicircular profile etc.

In the fifth step of this preferred embodiment, the hard carrier 7 is concentrically attached to the top surface 5 of the adhesive tape 4. Due to the fact that hard carrier 7 and adhesive tape 4 are formed congruently, these two parts form in this preferred embodiment a continuous circumferential surface. The attachment of hard carrier 7 to adhesive tape 4 is achieved by connecting means 10 that allow for a later detachment of hard carrier 7 from adhesive tape 4 without damage of the hard carrier 7.

The connecting means can exhibit adhesive characteristics that can be influenced by application of energy, for instance UV-radiation, for instance UV-curable glue. The glue can be UV-curable glue 10, preferably in form of a double-sided tape. The tape 10 is provided in the recess 8 of the hard carrier 7 for attaching the hard carrier 7 to the adhesive tape 4. Due to the configuration of the recess 8, the tape 10 is completely situated in the peripheral marginal area 3 of the wafer W, thereby not extending into the device area 2, as illustrated in FIG. 4. The wafer W, the adhesive tape 4 and the hard carrier 7 form in this preferred embodiment after this fifth step a unit with constant, or approximately constant, diameter. This unit, and especially the adhesive tape 4, is structurally supported by the rigid hard carrier 7, which is attached to the adhesive tape 4 with the UV-curable glue of the tape 10 provided in the recess 8. When UV-curable glue 10 is used as a connecting means, the hard carrier 7 is preferably made of glass. This allows for UV-radiation to penetrate through the carrier 7 to cure the glue 10 in the recess 8 such that the glue loses its adhesive characteristics and the carrier 7 can be easily detached without being damaged.

Alternatively, instead of the UV-curable glue 10, a heat-curable tape, preferably a double-sided tape, can be used as connecting means for attaching the hard carrier 7 to the adhesive tape 4. This tape is preferably arranged in the recess 8 of the hard carrier 7. Such a heat-curable tape allows for an easy detaching of the hard carrier 7 from the adhesive tape 4 by applying heat to the heat-curable tape without damage of the carrier 7. This configuration allows for the use of silicon as a material for the hard carrier 7 since no transparency thereof is needed. Alternatively, water-soluble glue can be used.

It is also possible that the connecting means is provided in the form of a dispensed liquid glue. The liquid glue will dry and connect the adhesive tape 4 and the hard carrier 7 to each other. This glue can be arranged in the recess 8. The recess 8 can be provided at the circumferential surface of the adhesive tape 4, the circumferential surface of the hard carrier 7 or within both. The liquid glue can then be provided at the interface of the adhesive tape 4 and the hard carrier 7 within the recess. The recess 8 can exhibit a triangular cross section. It is also possible that no recess is provided. To detach the hard carrier 7 from the adhesive tape 4, a knife or any other mechanically cutting devices can be used for cutting the glue to detach the hard carrier 7 from the adhesive tape 4 without damage. Alternatively, the liquid glue may be curable by an external stimulus, such as UV radiation or heat. In this case, the hard carrier 7 may be detached from the adhesive tape 4 by applying the external stimulus to the glue, thereby curing the glue and thus lowering its adhesive force, and subsequently removing the hard carrier 7 from the adhesive tape 4. Further, the liquid glue may be a water soluble glue, allowing for the hard carrier 7 to be removed from the adhesive tape 4 by applying water to the glue.

In all of the above configurations of the connecting means, the connecting means is situated in the outer annual portion s of the hard carrier 7 only, thereby not extending into the device area 2 of the wafer W.

Figure 5:
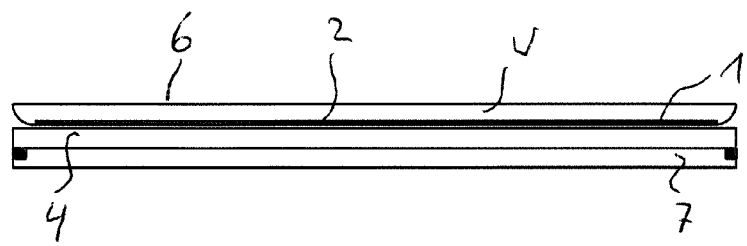
FIG. 5 is a cross-sectional view illustrating a sixth step of the method for dividing a wafer according to the preferred embodiment of the present invention.

FIG. 5 illustrates the outcome of a sixth step of this preferred embodiment. In this sixth step, the wafer W, to which the adhesive tape 4 is attached, wherein the hard carrier 7 is mounted to the adhesive tape 4, is ground from its back surface 6 with a grinding device to a desired thickness. The thickness can be the final thickness of the dies. Such a grinding device can include one or more diamond wheels.

Figure 6:
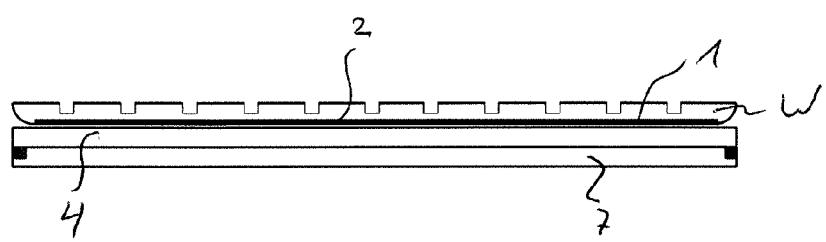
FIG. 6 is a cross-sectional view illustrating a seventh step of the method for dividing a wafer according to the preferred embodiment of the present invention.

In a seventh step of this preferred embodiment, the wafer W is cut from its back surface 6 along the streets formed on the pattern side 1 thereof from the back side with a mechanical cutting device, such as a saw. The cutting can be a complete cutting such that the dies are separated by this seventh step form one another. Alternatively, the cutting can be only a so-called half cut, leaving some wafer material in the height direction. FIG. 6 depicts such a half-cut cutting in the seventh step.

Figure 7:
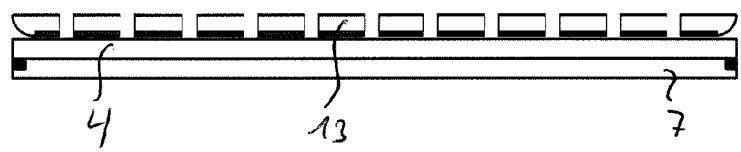
FIG. 7 is a cross-sectional view illustrating an eighth step of the method for dividing a wafer according to the preferred embodiment of the present invention.

If in the seventh step only a half-cut is performed, the wafer W is fully cut such that the dies 13 are separated from one another in an eighth step, the outcome of which is illustrated in FIG. 7. In this eighth step, the remaining silicon of the wafer W in the height direction along the streets is cut with a laser from the backside 6 of wafer W. This is especially advantageous if the wafer W exhibits a so called low-k material on its pattern side 1. Such a low-k material is very brittle. A cutting thereof with a laser ensures a good cutting quality. After the dies 13 have been completely separated from one another, they respectively adhere to the adhesive tape 4, to which the hard carrier 7 is attached, as illustrated in FIG. 7.

Figure 8:
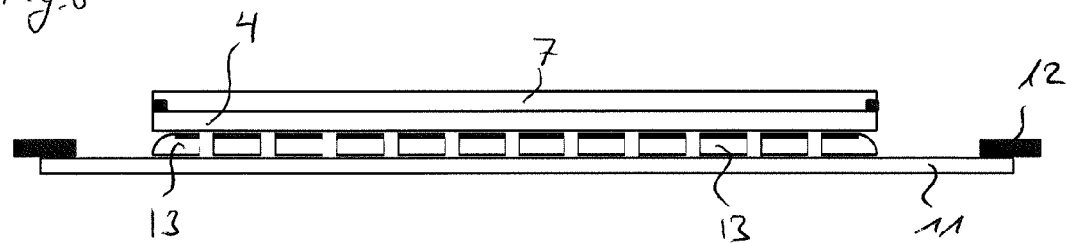
FIG. 8 is a cross-sectional view illustrating a ninth step of the method for dividing a wafer according to the preferred embodiment of the present invention.

In a ninth step of the preferred embodiment, the outcome thereof being shown in FIG. 8, the individual dies 13 respectively held by the adhesive tape 4 and the hard carrier 7 are placed on an adhesive pick up tape 11 mounted on a ring frame 12. The unit of dies 13, adhesive tape 4 and hard carrier 7 is placed on the adhesive pick up tape in such a way that the ground surface of the dies 13 contacts the adhesive pick up tape, as shown in FIG. 8.

Figure 9:
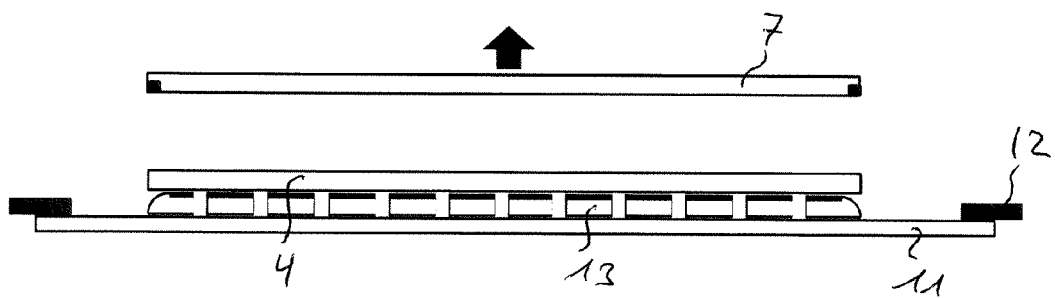
FIG. 9 is a cross-sectional view illustrating a tenth step of the method for dividing a wafer according to the preferred embodiment of the present invention.

In a tenth step of the preferred embodiment, shown in FIG. 9, energy is applied to the connecting means or the connecting means are transformed in any other way such that the connection between hard carrier 7 and adhesive tape 4 is released, allowing for a removing of the hard carrier 7 from the adhesive tape 4. In this embodiment, the connecting means 10 is configured in such a way that this detachment of hard carrier 7 is possible without damaging the carrier 7. Since the connecting means is merely situated in the peripheral marginal area 3 of the wafer W, the dies 13 are not damaged during this releasing of the connecting means 10.

Figure 10:
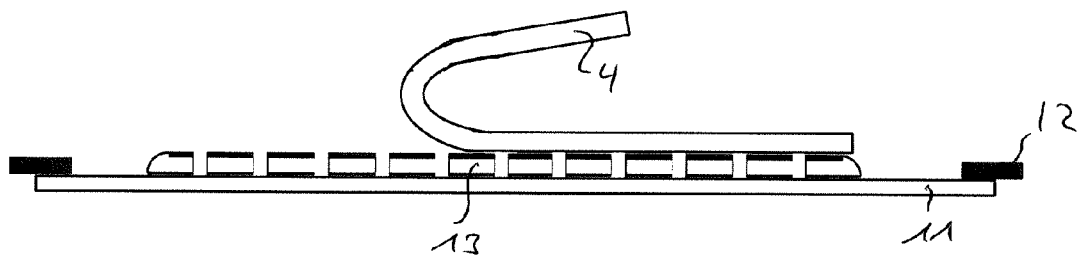
FIG. 10 is a cross-sectional view illustrating an eleventh step of the method for dividing a wafer according to the preferred embodiment of the present invention.

FIG. 10 depicts an eleventh step of the preferred embodiment, in which the adhesive tape 4 is removed from the dies 13, thereby releasing the individual dies to be picked up from the adhesive pick up tape 11 by a pick up device. The distance between the individual dies can be increased by radially stretching the pick up tape to facilitate the pick up.

It is to be noted that the cutting of the wafer W along the street can also be performed before the previously described grinding step. In such a case, the wafer W is preferably cut from the pattern side 1 along the streets to a depth corresponding to the height of the final dies. The individual dies 13 are then separated in the grinding step, in which wafer W is ground down from the backside 6 such that the downsides of the cuts are reached. Preferably, such cutting is performed before attaching the adhesive tape 4 to the wafer W. The remaining steps of such a processing method correspond to those previously described.

The invention claimed is:

1. Method of dividing a circular wafer, having on one side a device area with a plurality of devices partitioned by a plurality of division lines and a peripheral marginal area with no devices formed around the device area, into dies, the method comprising:
    attaching an adhesive tape for protecting devices on the wafer to the one side of the wafer, the adhesive tape adhering to all of the devices;
    connecting a carrier for supporting the adhesive tape to the side of the adhesive tape being opposite to the side in contact with the devices by connecting means, the connecting means exhibiting an annular shape about the peripheral marginal area and not extending to a center of the wafer;
    grinding the side of the wafer being opposite to the one side for adjusting the wafer height; and
    cutting the wafer along the division lines.

2. The method according to claim 1, wherein the connecting means exhibits adhesive characteristics being removable by energy input, the connecting means preferably including UV-curable glue, thermal-curable glue, or a combination thereof.

3. The method of claim 2, further comprising inputting energy into the connecting means for releasing the connection between carrier and adhesive tape, and
    removing the carrier from the adhesive tape.

4. The method according to claim 1, further comprising forming a recess, preferably an annular recess, in the carrier for insertion of the connecting means.

5. The method according to claim 1, wherein the one side of the wafer is partially cut by laser and a further area of the wafer is cut mechanically.

6. The method according to claim 5, wherein the further area of the wafer is cut mechanically from the one side of the wafer or from the side of the wafer being opposite to the one side.

7. The method according to claim 1, wherein the side of the wafer being opposite to the one side is mechanically partially cut and a further area of the wafer is cut by laser from the side of the wafer being opposite to the one side.

8. The method according to claim 1, wherein the cutting of the wafer is performed before grinding of the wafer.

9. The method according to claim 1, wherein the steps of claim 1 are performed in the listed order.

10. The method according to claim 1, wherein the surface of the adhesive tape opposite the surface contacting the devices is parallelized with the surface of the wafer opposite the one side.

11. The method according to claim 1, further comprising attaching an adhesive pick up tape to the ground surface of the wafer.

12. The method according to claim 1, wherein the carrier is made of silicon and/or glass.

* * * * *